US009082633B2

(12) United States Patent
Grant

(10) Patent No.: US 9,082,633 B2
(45) Date of Patent: Jul. 14, 2015

(54) MULTI-DIE INTEGRATED CIRCUIT STRUCTURE WITH HEAT SINK

(75) Inventor: Douglas M. Grant, Gorebridge (GB)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 13/272,500

(22) Filed: Oct. 13, 2011

(65) Prior Publication Data

US 2013/0093074 A1  Apr. 18, 2013

(51) Int. Cl.
| H01L 23/34 | (2006.01) |
| H01L 29/40 | (2006.01) |
| H01L 25/065 | (2006.01) |
| H01L 23/367 | (2006.01) |
| H01L 23/433 | (2006.01) |
| H01L 23/40 | (2006.01) |
| H01L 23/552 | (2006.01) |

(52) U.S. Cl.
CPC ........ *H01L 25/0655* (2013.01); *H01L 23/3675* (2013.01); *H01L 23/3677* (2013.01); *H01L 23/433* (2013.01); *H01L 23/34* (2013.01); *H01L 23/552* (2013.01); *H01L 2023/405* (2013.01); *H01L 2023/4037* (2013.01); *H01L 2023/4043* (2013.01); *H01L 2023/4068* (2013.01); *H01L 2224/14181* (2013.01); *H01L 2224/16145* (2013.01); *H01L 2224/16225* (2013.01); *H01L 2224/16245* (2013.01); *H01L 2224/32245* (2013.01); *H01L 2224/73253* (2013.01); *H01L 2924/157* (2013.01); *H01L 2924/15192* (2013.01); *H01L 2924/15311* (2013.01)

(58) Field of Classification Search
CPC ............ H01L 23/34; H01L 2023/4037; H01L 2023/4043; H01L 2023/405; H01L 2023/4068
USPC ...................... 257/712, E23.08, E23.104, 706
IPC .................. H01L 23/34,2023/4037, 2023/4043, H01L 2023/405, 2023/4068
See application file for complete search history.

(56) References Cited

U.S. PATENT DOCUMENTS

| 5,438,212 | A | * | 8/1995 | Okaniwa ........................ 257/275 |
| 5,825,088 | A | * | 10/1998 | Bartlow ......................... 257/712 |
| 6,281,575 | B1 | * | 8/2001 | Nishikawa et al. ............ 257/707 |
| 6,528,882 | B2 | * | 3/2003 | Ding et al. ..................... 257/738 |
| 6,696,643 | B2 | * | 2/2004 | Takano .......................... 174/520 |
| 6,818,974 | B2 | * | 11/2004 | Yokoyama et al. ........... 257/676 |
| 7,221,571 | B2 | * | 5/2007 | Kubo ............................. 361/719 |
| 7,223,679 | B2 | * | 5/2007 | Murthy et al. ................. 438/592 |
| 7,226,843 | B2 | * | 6/2007 | Weber et al. .................. 438/305 |
| 7,265,032 | B2 | * | 9/2007 | Sharan et al. ................. 438/460 |
| 7,268,077 | B2 | * | 9/2007 | Hwang .......................... 438/680 |
| 7,355,289 | B2 | * | 4/2008 | Hess et al. .................... 257/787 |

(Continued)

OTHER PUBLICATIONS

Sandru, Ovidiu, "Self-Propelling Water Cooling System Could Green Computers Up," [online] *The Green Optimistic*, Mar. 19, 2010, 7 pgs. [retrieved from the Internet Oct. 11, 2011]: <http://www.greenoptimistic.com/2010/03/19/chunlei-guo-silicon-capillary-cooling-system/>.

*Primary Examiner* — David Zarneke
(74) *Attorney, Agent, or Firm* — Kevin T. Cuenot; LeRoy D. Maunu

(57) ABSTRACT

An integrated circuit structure can include a first die including a first surface and a second surface and a second die including a first surface and a second surface. The first surface of the first die can be coupled to the second surface of the second die. The integrated circuit structure also can include a heat sink coupled to the first surface of the first die and the first surface of the second die.

17 Claims, 6 Drawing Sheets

(56) References Cited

U.S. PATENT DOCUMENTS

| | | | |
|---|---|---|---|
| 7,446,409 B2* | 11/2008 | Yang | 257/707 |
| 7,928,562 B2* | 4/2011 | Arvelo et al. | 257/712 |
| 7,948,076 B2* | 5/2011 | Wang et al. | 257/707 |
| 7,952,191 B2* | 5/2011 | Sunohara et al. | 257/712 |
| 8,350,363 B2* | 1/2013 | Chaabouni et al. | 257/621 |
| 8,525,214 B2* | 9/2013 | Lin et al. | 257/99 |
| 2003/0222341 A1* | 12/2003 | Oberhardt et al. | 257/706 |
| 2004/0124512 A1 | 7/2004 | Tao et al. | |
| 2004/0196634 A1 | 10/2004 | Mallik et al. | |
| 2005/0029651 A1* | 2/2005 | Tomioka et al. | 257/712 |
| 2005/0036291 A1 | 2/2005 | Huang et al. | |
| 2006/0087009 A1 | 4/2006 | Yang | |
| 2006/0109632 A1* | 5/2006 | Berlin et al. | 361/719 |
| 2006/0197181 A1 | 9/2006 | Noguchi | |
| 2006/0236711 A1* | 10/2006 | Vaiyapuri et al. | 62/259.2 |
| 2008/0179718 A1 | 7/2008 | Wu | |
| 2008/0237841 A1* | 10/2008 | Arana et al. | 257/712 |
| 2008/0272453 A1* | 11/2008 | Richardson | 257/432 |
| 2010/0019377 A1* | 1/2010 | Arvelo et al. | 257/712 |
| 2011/0012255 A1* | 1/2011 | Suganuma | 257/712 |
| 2011/0150669 A1* | 6/2011 | Frayne et al. | 417/53 |
| 2012/0202373 A1* | 8/2012 | Klinghult | 439/485 |

* cited by examiner

MULTI-DIE INTEGRATED CIRCUIT STRUCTURE WITH HEAT SINK

FIELD OF THE INVENTION

One or more embodiments disclosed within this specification relate to integrated circuits (ICs). More particularly, one or more embodiments relate to a multi-die IC structure with a heat sink.

BACKGROUND

Multi-die integrated circuits (ICs) are a class of ICs in which multiple dies are placed within a single package. A multi-die IC also can be referred to as a "system in a package" or "SiP." The multiple dies communicate with one another often at faster speeds than is attainable were the dies to be implemented as two or more individual IC packages mounted on a printed circuit board.

ICs that include a single die can generate a significant amount of heat. As the number of dies included within a single package increases, so too can the heat generated by the resulting structure. As such, a multi-die IC can generate a significant amount of heat and, in some cases, more than is typically generated by single die ICs. Further, the architectural features of a multi-die IC structure can make the regulation of heat dissipation difficult.

Dissipating heat is an important aspect of IC design for a variety of reasons. For example, devices such as transistors that are implemented within ICs tend to operate more slowly with increasing temperature. In another example, increases in the temperature of an IC structure can exacerbate stresses within the IC. Stresses can occur due to the varying expansion rates of the component materials used to fabricate a semiconductor IC.

SUMMARY

One or more embodiments disclosed within this specification relate to integrated circuits (ICs) and, more particularly, to a multi-die IC structure with a heat sink.

An embodiment can include an IC structure. The IC structure can include a first die including a first surface and a second surface and a second die including a first surface and a second surface. The first surface of the first die can be coupled to the second surface of the second die. The integrated circuit structure also can include a heat sink coupled to the first surface of the first die and the first surface of the second die.

The heat sink can be coupled to the first surface of the first die through a plurality of solder bumps. The heat sink can be coupled to the first surface of the second die using a thermally conductive adhesive. In another aspect, the heat sink can be coupled to the first surface of the second die through a plurality of solder bumps.

The heat sink can include at least one channel extending from a top surface of the heat sink through to a bottom surface of the heat sink.

The heat sink can be electrically coupled to a ground potential of the integrated circuit structure.

In another aspect, the heat sink can include a plurality of ridges in a top surface of the heat sink.

The IC structure also can include a package at least partially encompassing the first die and the second die. The heat sink can form a top portion of the package.

The first die of the IC structure can include at least one thermal wire coupled to the heat sink. In another aspect, the second die can include at least one thermal wire coupled to the heat sink.

In another aspect, the IC structure can include a fan coupled to the heat sink. The fan can be coupled to a power source. In still another aspect, the fan can be implemented as a micro-machine within the heat sink.

Another embodiment can include an IC structure. The IC structure can include an interposer including a first wire and a second wire, a first die coupled to a surface of the interposer, and a second die coupled to the surface of the interposer. The first die and the second die can be communicatively linked through the interposer by the first wire. The IC structure also can include a heat sink coupled to the interposer, the first die, and the second die. The heat sink can be coupled to the second wire. The second wire can be configured so as to not propagate an electrical signal.

The heat sink can couple to the surface of the interposer through solder bumps. In one aspect, the heat sink can couple to a first portion of the surface of the interposer between a second portion of the surface of the interposer coupled to the first die and a third portion of the surface of the interposer coupled to the second die.

The heat sink can be coupled to a ground potential of the IC structure.

In another aspect, the first die and/or the second die can include at least one thermal wire that is not configured to propagate an electrical signal and that is coupled to the heat sink.

In still another aspect, the IC structure can include a package at least partially encompassing the interposer, the first die, and the second die. The heat sink, for example, can form a top portion of the package.

Another embodiment can include an IC structure. The IC structure can include an interposer, a first die coupled to a surface of the interposer, and a second die coupled to the surface of the interposer. The IC structure can include a heat sink coupled to the interposer, the first die, and the second die and a package at least partially encompassing the interposer, the first die, and the second die. The heat sink can form a top portion of the package.

In one aspect, the interposer can include a wire that is not configured to propagate an electrical signal. The heat sink can be coupled to the wire.

DETAILED DESCRIPTION

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to a multi-die IC structure (IC structure) with a heat sink. In accordance with the inventive arrangements disclosed within this specification, an IC structure is described that includes a heat sink. The heat sink can be coupled to two or more, or each, die within the IC structure. Thermal wires can be implemented within one or more of the dies of the IC structure to facilitate transfer of heat from the die(s) to the heat sink. Further, the heat sink can be integrated into the package of the IC structure.

Figure 1:
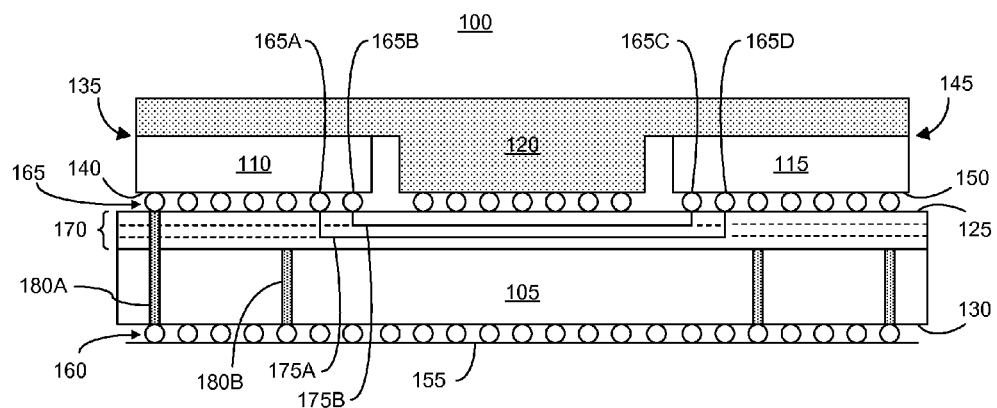
FIG. 1 is a first block diagram illustrating a cross-sectional side view of a multi-die IC structure (IC structure) in accordance with one or more embodiments disclosed within this specification.

FIG. 1 is a first block diagram illustrating a cross-sectional side view of an IC structure 100 in accordance with one or more embodiments disclosed within this specification. IC structure 100 can include a silicon interposer (interposer) 105, a die 110, a die 115, and a heat sink 120. IC structure 100 illustrates a packing approach in which multiple dies can be stacked within a single package.

Interposer 105 can be a die including a first surface 125 and a second surface 130. Die 110 can include a first surface 135 and a second surface 140. Similarly, die 115 can include a first surface 145 and a second surface 150. In an aspect, each of surfaces 125-150 can be planar surfaces. For example, surface 125 can be a planar surface on which dies 105 and 110 can be horizontally stacked. In general, dies 110 and 115 can be located on surface 125 of interposer 105 side-by-side. It should be appreciated, however, that dies 105 and 110 can be separated by a portion of heat sink 120 as illustrated.

Surface 130 can be coupled to a surface 155. Surface 155 can represent, for example, a portion, e.g., a bottom portion, of a package within which IC structure 100 can be implemented. Surface 130 can be electrically coupled to surface 155 using solder bumps 160. Solder bumps 160 further can couple IC structure 100 directly to a node external to the multi-die IC package. In an embodiment, solder bumps 160 can be implemented in the form of "C4-bumps." For example, solder bumps 160 can be used to physically attach interposer 105 to surface 155.

In general, interposer 105 can provide a common mounting surface, e.g., surface 125, and electrical coupling point for two or more dies of IC structure 100. Interposer 105 can serve as an intermediate layer for interconnect routing between dies or as a ground or power plane for IC structure 100. Interposer 105 can be implemented with a silicon wafer substrate, whether doped or un-doped with an N-type and/or a P-type impurity. The manufacturing of interposer 105 can include one or more additional process steps that allow the deposition of one or more layer(s) of interconnect material, e.g., metal, labeled 170. These interconnect, e.g., metal, layers can be implemented using aluminum, gold, copper, nickel, various silicides, and/or the like.

Each of dies 110 and 115 can be electrically coupled to interposer 105 through solder bumps 165. In addition, each of solder bumps 165 can serve to physically attach dies 110 and 115 to interposer 105. Through solder bumps 165, for example, surface 125 of interposer 105 can be coupled to surface 140 of die 110 and to surface 150 of die 115. In an embodiment, solder bumps 165 can be implemented in the form of "micro-bumps."

In the illustrated structure, the coupling of dies 110 and 115 to interposer 105 is accomplished through solder bumps 165. However, a variety of other techniques can be used to couple interposer 105 to dies 110 and 115. For example, bond wires or edge wires can be used to couple dies 110 and 115 to interposer 105. In another example, an adhesive material can be used to physically attach dies 110 and 115 to interposer 105. As such, the coupling of dies 110 and 115 to interposer 105 using solder bumps 165, as illustrated within FIG. 1, is provided for purposes of illustration and is not intended to limit the one or more embodiments disclosed within this specification.

As noted, interconnect material 170 within interposer 105 can be used to pass inter-die signals between dies 110 and 115. Interconnect material 170 can include one or more conductive, e.g., patterned metal, layers forming wires or interconnects. For example, interconnect 175, illustrated as interconnects 175A and 175B, can be formed using one or more of the patterned metal layers of interconnect material 170. As shown, interconnect 175A can be coupled to each of solder bumps 165A and 165D. Interconnect 175B can be coupled to each of solder bumps 165B and 165C. Thus, each of interconnects 175A and 175B couples die 110 to die 115, thereby allowing the exchange of inter-die signals between dies 110 and 115. In another example, interconnect material 170 further can include one or more vias so that interconnect 175 can be implemented within two or more different conductive layers coupled together using vias within interposer 105. The use of multiple conductive layers to implement interconnects within interposer 105 allows a greater number of signals to be routed and more complex routing of signals to be achieved within interposer 105. It should be appreciated that more than one interconnect, e.g., tens, hundreds, or thousands, can be used to couple die 110 with die 115 through interposer 105.

Interposer 105 can be manufactured using one or more additional process steps that allow the deposition of one or more dielectric or insulating layer(s) such as, for example, silicon dioxide. In addition, interposer 105 can be manufactured using one or more additional process steps that allow the creation of active circuit elements such as, for example, transistor devices and/or diode devices. In other embodiments, some or all of these additional process steps are omitted.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

Interposer 105 can include one or more through silicon vias (TSVs) 180. In general, an interposer is a die that is characterized by the presence of one or more TSVs 180 as will be described in greater detail within this specification. TSVs 180 represent vias that, when filled with conductive material, form an electrical connection that vertically transverses, e.g., extends through a substantial portion, if not the entirety of, interposer 105.

In general, TSVs 180 can be implemented by drilling or etching an opening into interposer 105. In one aspect, the opening can extend from surface 125 through to surface 130. Conductive material then can be deposited within the opening to form a TSV such as TSV 180A. Examples of conductive material that can be used to form TSVs 180 can include, but are not limited to, aluminum, gold, copper, nickel, various silicides, and/or the like. In another example, a TSV such as TSV 180B can traverse substantially through interposer 105 to couple solder bumps 160 and couple to one or more interconnects and/or vias formed within or using interconnect material 170. In that case, TSV 180B can couple solder bumps 160 with solder bumps 165 using interconnect material 170 as opposed to extending entirely through interposer 105 as illustrated with respect to TSV 180A.

TSVs 180, in combination with solder bumps 160 and 165, couple die 110 and die 115 to surface 155. As shown, surface 125 of interposer 105 can be physically coupled to dies 110 and 115. Surface 130 of interposer 105 can be physically coupled to surface 155.

Heat sink 120 can be coupled to surface 135 of die 110 and to surface 145 of die 115. In one aspect, heat sink 120 can be coupled to surfaces 135 and 145 using a thermally conductive adhesive. In this regard, heat generated by each of dies 110 and 115 can flow into heat sink 120 for dissipation. Heat sink 120 also can be coupled to surface 125 of interposer 105. As shown, heat sink 120 can couple to surface 125 through a plurality of solder bumps 165.

Heat sink 120 can be implemented using metals, ceramics, or other materials known to be used in forming heat sinks in general. Other examples of materials that can be used to form heat sink 120 can include, but are not limited to, aluminum, aluminum alloys such as 1050A, 6061, 6063, copper, diamond, synthetic diamond, and composite materials such as silicon carbide in an aluminum matrix, diamond in a copper-silver alloy matrix, and beryllium oxide in a beryllium matrix. The latter material examples can be matched to the thermal properties of the silicon itself, simplifying construction.

Figure 2:
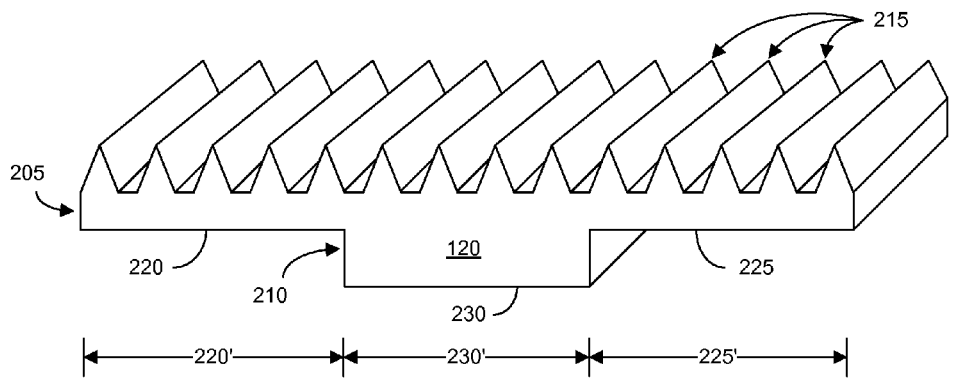
FIG. 2 is a perspective view of a heat sink in accordance with another embodiment disclosed within this specification.

FIG. 2 is a perspective view of a heat sink in accordance with another embodiment. More particularly, FIG. 2 illustrates another embodiment of heat sink 120 of FIG. 1. Like numbers are used to refer to the same items throughout this specification.

FIG. 2 depicts heat sink 120 in isolation to better illustrate various features. For example, heat sink 120 generally can be formed in a "T" like shape having a top portion 205 that is substantially parallel to surfaces 125, 135, and 145 of interposer 105, die 110, and die 115 respectively. Heat sink 120 further can include a stem portion 210 that extends down from, and below, top portion 205 to couple with interposer 105 (not shown). In another aspect, heat sink 120 optionally can include a plurality of ridges 215 that increase surface area of the top surface of top portion 205 to facilitate improved heat dissipation.

Heat sink 120 can include a surface 220 representing a bottom or underside of top portion 205 and another surface 225 representing a bottom or underside of top portion 205. Heat sink 120 further includes a surface 230 representing a bottom or underside portion of stem portion 210 that separates surface 220 from surface 225. Arrows with reference numbers 220', 230', and 225' illustrate the relationship of surfaces 220, 230, and 225 respectively in terms of the boundaries between each respective surface. FIG. 2 illustrates that surface 220 and 225 are located within a same plane, while surface 230 is located in a different plane beneath that of surfaces 220 and 225.

Figure 3:
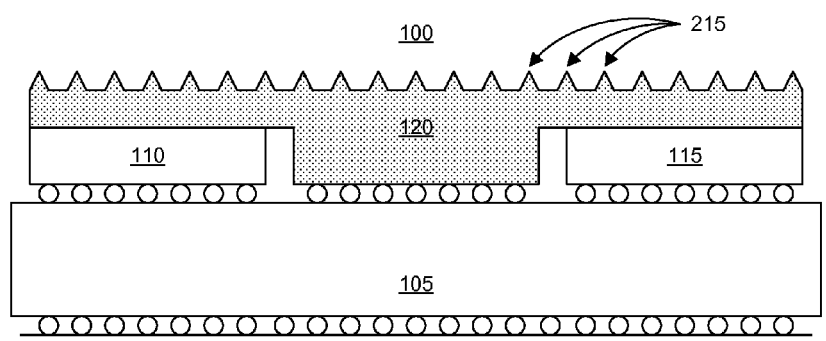
FIG. 3 is a second block diagram illustrating a cross-sectional side view of the IC structure of FIG. 1 in accordance with another embodiment disclosed within this specification.

FIG. 3 is a second block diagram illustrating a cross-sectional side view of IC structure 100 in accordance with another embodiment. More particularly, FIG. 3 illustrates an embodiment in which heat sink 120 is configured to include ridges 215 on a top portion as described and illustrated with reference to FIG. 2.

In another aspect, die 110 and/or die 115 can be implemented as a stacked die combination of two or more dies. As one example, memory can be implemented using two more dies that are stacked on top of one another, e.g., using flip-chip type of technology. In this regard, the illustration of die 110 and/or die 115 as a single block is not intended to preclude embodiments in which one or both respective dies are implemented using two or more dies as described.

Figure 4:
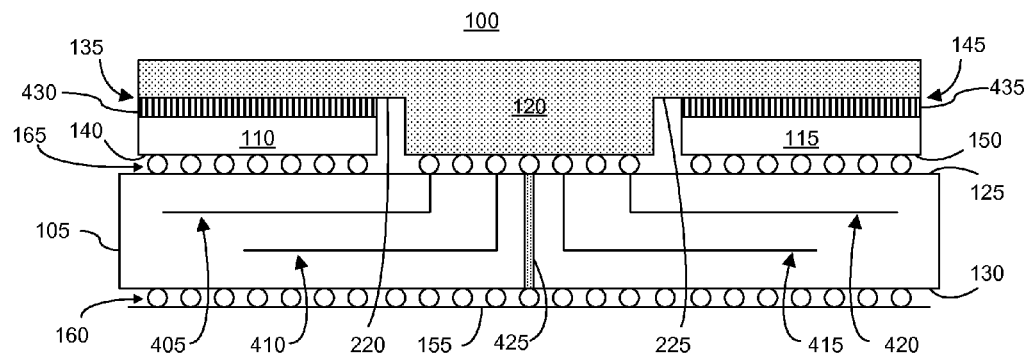
FIG. 4 is a third block diagram illustrating a cross-sectional side view of the IC structure of FIG. 1 in accordance with another embodiment disclosed within this specification.

FIG. 4 is a third block diagram illustrating a cross-sectional side view of IC structure 100 in accordance with another embodiment. FIG. 4 illustrates an embodiment in which interconnect material can be used to form one or more thermal wires 405, 410, 415, and 420 within interposer 105. In one aspect, one or more metal layers can be formed throughout interposer 105 to facilitate more even distribution of thermal wires 405-420. For example, the interconnect material need not be layered near surface 125 of interposer 105, but rather can be spaced at varying levels throughout interposer 105 between surface 125 and surface 130.

A "thermal wire" can refer to a portion of interconnect material, e.g., a wire, within interposer 105 that is not configured to convey or propagate an electrical signal. For example, a thermal wire is not coupled to a source capable of generating a signal. In another example, a thermal wire is not coupled to a load capable of receiving a signal. In some cases, a thermal wire is not coupled to a source or a load. Rather, the thermal wire is intended to convey or propagate thermal energy, e.g., heat, in this case to heat sink 120 for dissipation.

For example, thermal wires 405-420 can be formed using interconnect material, e.g., patterned metal layers and vias, to couple to heat sink 120 through solder bumps 165. Thermal energy can be propagated through thermal wires 405-420 to heat sink 120 in this manner, e.g., through solder bumps 165.

Thermal wires 405-420 can be distributed throughout interposer 105. As shown, thermal wires 405-420 can extend in a plane parallel to surface 130 in one or more different process layers of interposer 105 to better conduct thermal energy from within interposer 105 to heat sink 120. The distribution of thermal wires 405-420, in addition to allowing thermal energy to flow from interposer 105 to heat sink 120, also reduces the likelihood of hotspots occurring within interposer 105 or other areas of IC structure 100, e.g., within die 110, die 115, or both dies 110 and 115. As such, thermal wires 405-420, in combination with heat sink 120, facilitate a more uniform operating temperature throughout interposer 105 and IC structure 100.

In another aspect, a TSV can be used to couple heat sink 120 to a voltage potential of IC structure 100. For example, TSV 425 can couple to heat sink 120 through a solder bump 165 and to a pin of the package for IC structure 100 via a solder bump 160. The pin of the package can be coupled to a voltage potential, e.g., a ground voltage potential. It should be appreciated that while TSV 425 is illustrated as the type that extends completely through interposer 105 from surface 125 to surface 130, e.g., the type corresponding to TSV 180A of FIG. 1, TSV 425 also can be implemented in the form of the other type of TSV, e.g., the type that corresponds to TSV 180B of FIG. 1, that couples to solder bumps 165 through interconnect material. TSV 425 also can propagate thermal energy to heat sink 120 for dissipation as heat.

It should be appreciated that heat sink 120 can be coupled to voltage potentials such as ground or a power source through one or more other types of connections. For example, heat sink 120 can be coupled to a selected voltage potential through interconnect and vias, e.g., that couple to selected voltage potentials within either one of dies 110 and/or 115. In another example, heat sink 120 can couple to a voltage potential through interconnect that couples to a TSV. Still, additional wires or circuitry not located within IC structure 100, e.g., external connections or circuitry, can be used to electrically couple heat sink 120 to a selected voltage potential.

As noted, heat sink 120 can couple to surface 135 of die 110 and to surface 145 of die 115. In an embodiment, die 110 can have a silicon oxide layer 430 as a topmost layer so that surface 135 of die 110 is formed of silicon oxide that is in contact with surface 220 of heat sink 120. Similarly, die 115 can have a silicon oxide layer 435 as a topmost layer so that surface 145 of die 115 is formed of silicon oxide in contact with surface 225 of heat sink 120. As noted, a thermally conductive adhesive can be used to ensure that die 110 and/or die 115 bonds with heat sink 120.

It should be appreciated that the particular number of thermal wires shown in FIG. 4 is not intended to limit the one or more embodiments disclosed within this specification. Additional or fewer thermal wires of varying shape and distribution within interposer 105 can be used without limitation.

Figure 5:
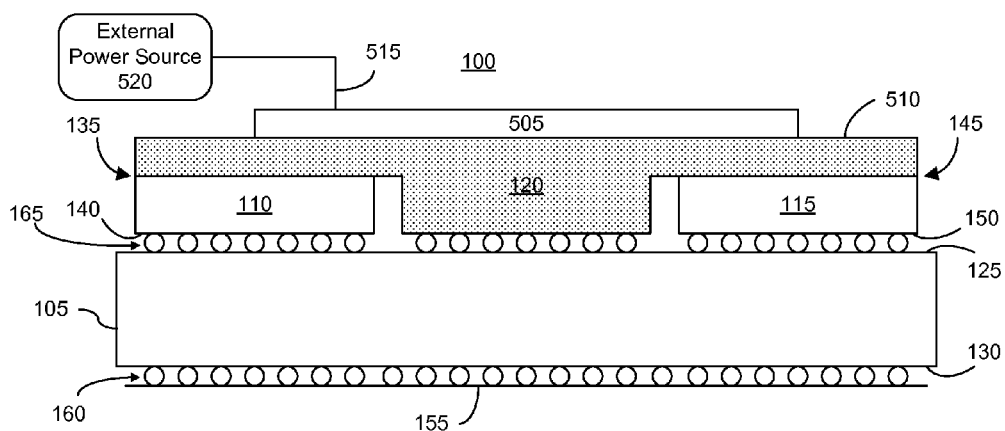
FIG. 5 is a fourth block diagram illustrating a cross-sectional side view of the IC structure of FIG. 1 in accordance with another embodiment disclosed within this specification.

FIG. 5 is a fourth block diagram illustrating a cross-sectional side view of IC structure 100 in accordance with another embodiment. FIG. 5 illustrates an embodiment in which a fan 505 can be implemented in conjunction with heat sink 120. In one aspect, fan 505 can be implemented on top of a surface 510 of top portion 205 of heat sink 120. For example, fan 505 can be coupled to an external power source 520 via an external connection 515. External connection 515 can represent wiring or circuitry that is not implemented within, or as part of, IC structure 100. External power source 520 may or may not be the same power source used to power IC structure 100.

In another aspect, for example, when fan 505 does not occupy the entire surface 510 of heat sink 120, ridges can be implemented surrounding fan 505. In that case, the portion of surface 510 that is occupied by fan 505 can be smooth so as to facilitate coupling, e.g., mechanical and/or thermal coupling, of fan 505 to surface 510. Other portions of surface 510 can be ridged as described with reference to FIGS. 2 and 3.

Figure 6:
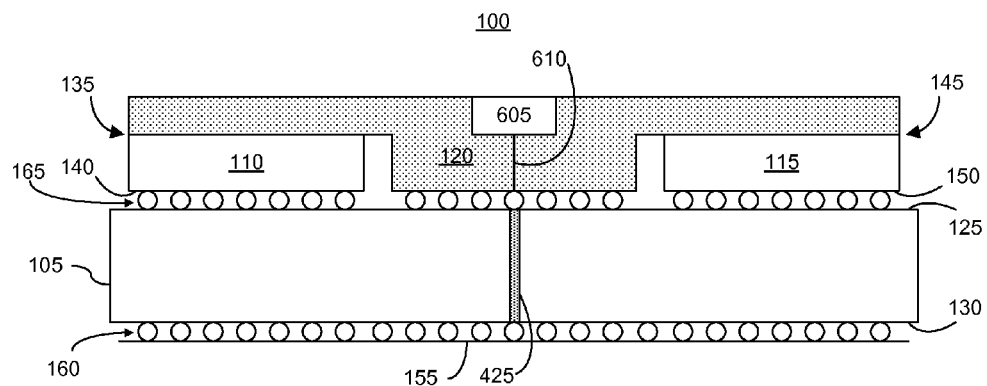
FIG. 6 is a fifth block diagram illustrating a cross-sectional side view of the IC structure of FIG. 1 in accordance with another embodiment disclosed within this specification.

FIG. 6 is a fifth block diagram illustrating a cross-sectional side view of IC structure 100 in accordance with another embodiment. FIG. 6 illustrates an embodiment in which a fan 605 can be implemented in conjunction with heat sink 120. Fan 605 can be implemented within, or as part of, heat sink 120. For example, heat sink 120 can be implemented or formed from a silicon material. In that case, fan 605 can be implemented as a micro-machine structure, or a plurality of micro-machine structures, e.g., fans, using the same or similar material as is used to form heat sink 120. For example, a fan 605 implemented as a micro-machine can be built from a material that can act or behave in a fan-like manner, e.g., have a rotatable turbine portion or propeller portion, under a power source.

In one aspect, a micro-machine fan can be created using etching or other IC fabrication technology and formed of one or more process layers. For example, a micro-machine fan can be constructed from etched, ablated, ground or cut silicon or similar material. In another example, a micro-machine fan can be constructed from polymerized liquid iron nano-particles. When constructed using polymerized liquid iron nano-particles, the resulting structure can be controlled magnetically and without physical contact.

In an embodiment, TSV 425 can be used to couple fan 605, or a terminal of fan 605, to a voltage potential, e.g., a power source or ground. Further TSVs can be used to provide both power and ground connections. In this regard, it should be appreciated that fan 605 can be coupled to one or more voltage potentials provided through package 155 to one or more TSVs and to one or more conductive paths 610 that extend from solder bumps 165 to appropriate terminals of fan 605 (not shown).

The illustrates provided herein are for purposes of illustration and, as such, are not intended to limit the one or more embodiments disclosed herein. For example, the various implementations in which a fan is provided can be powered from a voltage source that is coupled to the fan through package 155 to one or more TSVs and wires 610, through wiring in one or more dies, e.g., through interposer 105, die 110, die 115, or some combination of dies, through a combination of TSVs and wiring within one or more of the dies, or from an external power source coupled directly to the fan without traversing through any of the dies as implemented in FIG. 5. It should be appreciated that the fan illustrated in FIG. 5 also can be coupled to voltage sources as described with reference to FIG. 6.

Figure 7:
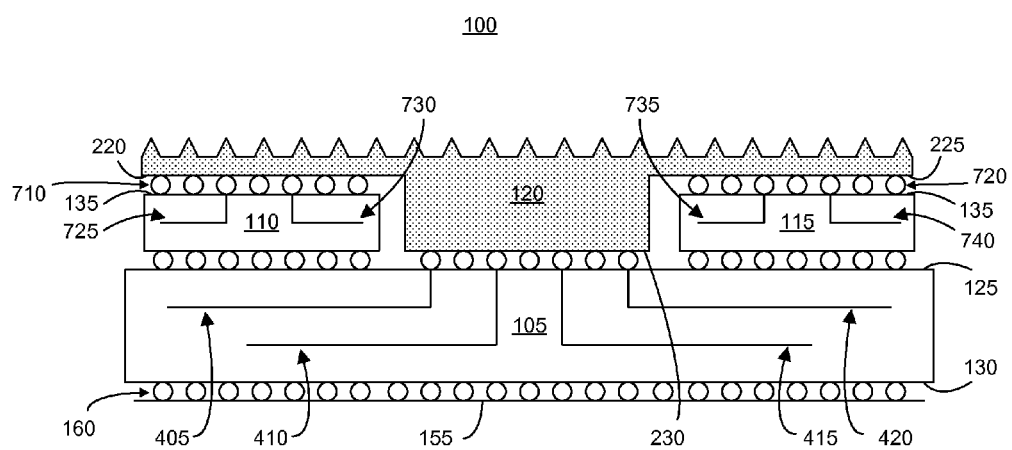
FIG. 7 is a sixth block diagram illustrating a cross-sectional side view of the IC structure of FIG. 1 in accordance with another embodiment disclosed within this specification.

FIG. 7 is a sixth block diagram illustrating a cross-sectional side view of IC structure 100 in accordance with another embodiment. FIG. 7 illustrates an embodiment in which die 110 is coupled to heat sink 120 through solder bumps 710. Solder bumps 710 couple surface 135 of die 110 with surface 220 of heat sink 120. Similarly, die 115 is coupled to heat sink 120 through solder bumps 720. Solder bumps 720 couple surface 135 of die 115 to surface 225 of heat sink 120. Surface 230 of heat sink 120 can continue to be coupled to surface 125 of interposer 105 via solder bumps 165. In an embodiment, solder bumps 710 and 720 can be implemented or formed as micro-bumps.

In another aspect, die 110, die 115, and/or both dies 110 and 115 optionally can include one or more thermal wires 725, 730, 735, and 740. Within die 110, thermal wires 725 and 730, for example, can couple to heat sink 120 and, more particularly, to surface 220 of heat sink 120 through solder bumps 710. Within die 115, thermal wires 735 and 740 can couple heat sink 120. More particularly, thermal wires 735 and 740 can couple to surface 225 of heat sink 120 via solder bumps 720.

In an embodiment, IC structure 100 can include thermal wires only within dies other than interposer 105. In another embodiment, only interposer 105 can include thermal wires, e.g., thermal wires 405-420. In still another embodiment, die 110, die 115, or both dies 110 and 115 can include thermal wires in addition to interposer 105. In any case, it should be appreciated that the particular number of thermal wires within a die, whether interposer 105, die 110, or die 115, is not intended to be limited to the examples shown. A single thermal wire can be included or more than one thermal wire can be included within any given die. Further, the particular shape of a thermal wire is not intended to be limited by the examples shown. In another example, a thermal wire can be implemented as an inverted "T" shape in which the thermal wire extends approximately the entire length of the die in parallel to surface 125 with one or more vias forming the stem of the "T" as opposed to extending throughout approximately one half of the die.

Figure 8:
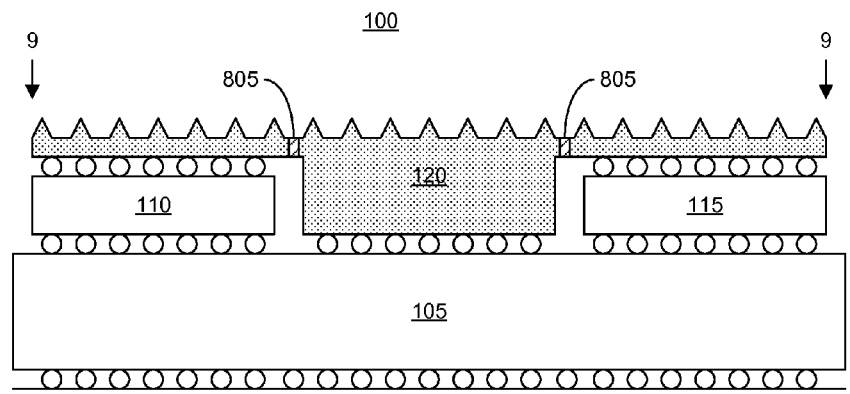
FIG. 8 is a seventh block diagram illustrating a cross-sectional side view of the IC structure of FIG. 1 in accordance with another embodiment disclosed within this specification.

FIG. 8 is a seventh block diagram illustrating a cross-sectional side view of IC structure 100 in accordance with another embodiment. FIG. 8 illustrates an embodiment in which heat sink 120 includes one or more channels, e.g., openings or holes, 805. In general, channels 805 allow the passage of air located between heat sink 120 and interposer 105, die 110, and/or die 115 to pass thereby alleviating any pressure that my build due to heating and/or cooling of the various elements of IC structure 100. For example, as the temperature of IC structure 100 increases, channels 805 allow air to flow thereby relieving any pressure build up that may occur in the cavities formed between interposer 105, die 110, die 115, and heat sink 120.

As shown, heat sink 120 can include ridges, though this need not be the case. It should be appreciated that channels 805 can be included in embodiments that include ridges, do not include ridges, include a fan, do not include a fan, or any combination thereof. Further, it should be appreciated that heat sink 120 can be implemented in any of a variety of different materials or combination of materials.

Channels 805 also can be used as openings through which air, liquid, e.g., water, or other heat-exchanging substance that aids in reducing overall heat can be pumped by conducting heat away from IC structure 100. Further, the ridges discussed within this specification are provided for purposes of illustration. In other examples, ridges can be generalized to another physical form, e.g., vanes, that aids the dispersion of heat into a surrounding medium, whether surrounding atmosphere, a vacuum, etc.

Figure 9:
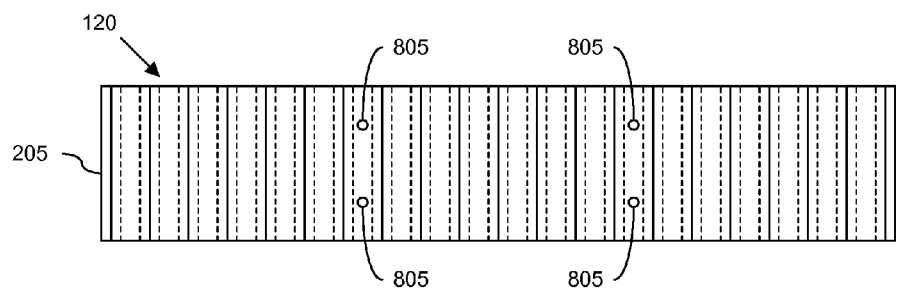
FIG. 9 is an eighth block diagram illustrating a top view of a heat sink of the IC structure of FIG. 8 in accordance with another embodiment disclosed within this specification.

FIG. 9 is an eighth block diagram illustrating a top view of heat sink 120 of IC structure 100 in accordance with another embodiment. FIG. 9 illustrates an example of the relative positioning of channels 805 as seen from an overhead view of top portion 205. As shown with reference to both FIGS. 8 and 9, channels 805 can be positioned so that channels 805 in heat sink 120 are not directly above any of the dies that are stacked on interposer 105.

Figure 10:
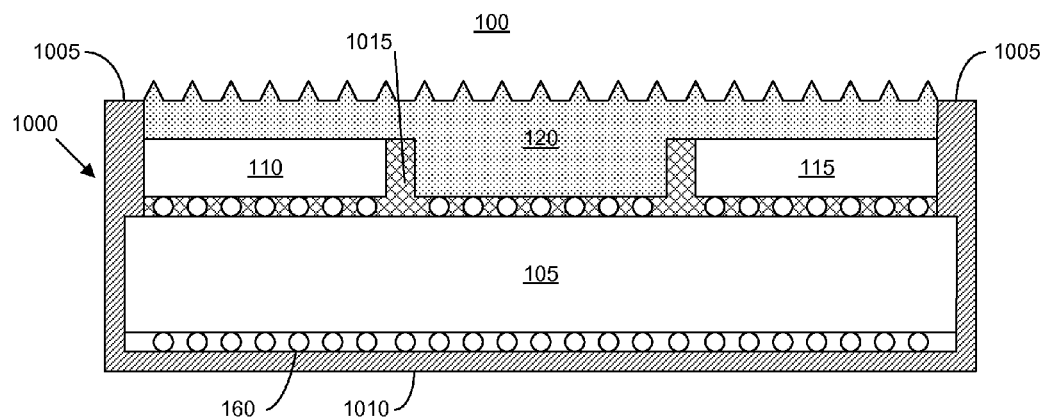
FIG. 10 is a ninth block diagram illustrating a cross-sectional side view of the IC structure of FIG. 1 in accordance with another embodiment disclosed within this specification.

FIG. 10 is a ninth block diagram illustrating a cross-sectional side view of IC structure 100 in accordance with another embodiment. FIG. 10 illustrates an embodiment in which IC structure 100 is enclosed, at least partially, by a package 1000. As shown, package 1000 can include side walls 1005 that encircle, or at least partially encompass, IC structure 100. Package 1000 further can include a bottom portion 1010, e.g., a package substrate and a bottom portion of the package itself whether ceramic, plastic, or the like, that can be coupled to interposer 105 via solder bumps 160. It should be appreciated that package 1000 can include a plurality of pins (not shown) that can be coupled to bottom portion 1010 and to solder bumps 160. As illustrated, heat sink 120 can be used to form a portion of package 1000. In the example shown in FIG. 10, heat sink 120 can be used to form a top portion of package 1000.

In another aspect, the inner cavity denoted with cross-hatching and labeled as 1015 that is formed between interposer 105, die 110, die 115, and heat sink 120 can be filled with an insulating material as opposed to being filled with air. When filled with an insulating material, openings within heat sink 120 as illustrated with reference to FIGS. 8 and 9 may nor may not be used.

Figure 11:
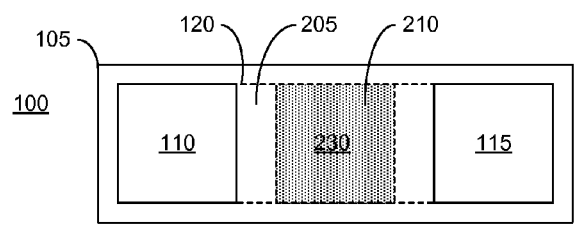
FIG. 11 is a tenth block diagram illustrating an overhead view of the IC structure of FIG. 1 in accordance with another embodiment disclosed within this specification.

FIG. 11 is a tenth block diagram illustrating an overhead view of IC structure 100 in accordance with another embodiment. In FIG. 11, heat sink 120, inclusive of top portion 205 and stem portion 210, are illustrated using a dashed line and shown in transparent form to better illustrate the relative positioning of interposer 105, die 110, and die 115 beneath. As discussed, stem portion 210 having a underside surface 230 contacts interposer 105 via one or more solder bumps.

Figure 12:
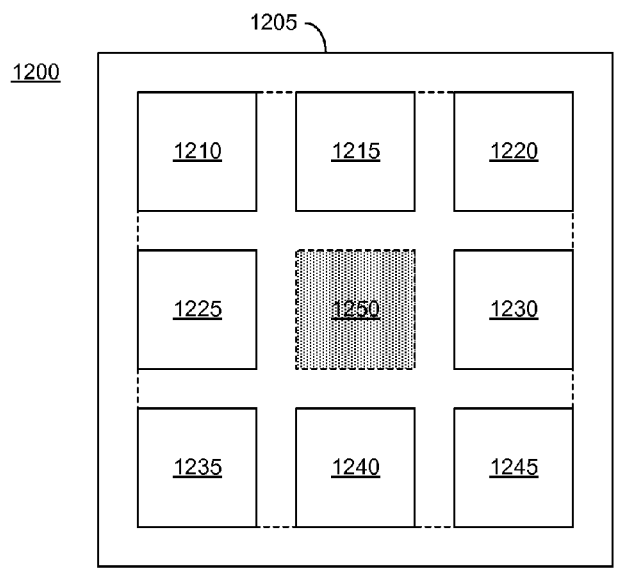
FIG. 12 is an eleventh block diagram illustrating an overhead view of an IC structure in accordance with another embodiment disclosed within this specification.

FIG. 12 is an eleventh block diagram illustrating an overhead view of an IC structure 1200 in accordance with another embodiment. IC structure 1200 can include an interposer 1205 and a plurality of dies 1210-1245 coupled on top of interposer 1205. A heat sink 1250 is illustrated using a dashed line and is shown in transparent form to illustrate the positioning of dies 1210-1245 and interposer 1205 beneath. Heat sink 1250 can include a stem portion 1250 that contacts interposer 1205 through one or more solder bumps.

Figure 13:
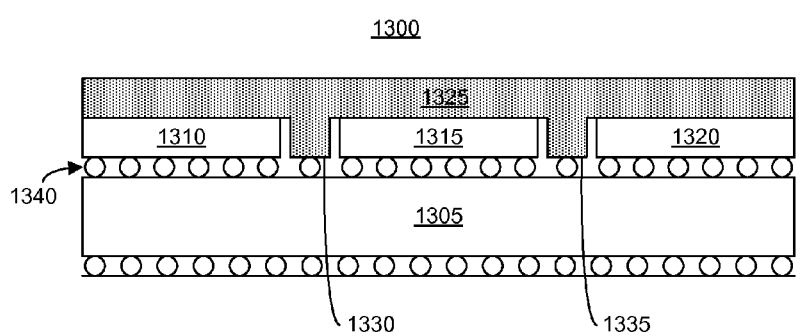
FIG. 13 is a twelfth block diagram illustrating a cross-sectional side view of an IC structure in accordance with another embodiment disclosed within this specification.

FIG. 13 is a twelfth block diagram illustrating a cross-sectional side view of an IC structure 1300 in accordance with another embodiment. IC structure 1300 can include an interposer 1305, dies 1310, 1315, and 1320, and a heat sink 1325. As shown, heat sink 1325 can contact interposer 1305 in multiple locations. In the example, shown, heat sink 1325 can include stem portions 1330 and 1335. Stem portion 1330 and stem portion 1335 each can couple to interposer 1305 via solder bumps 1340. For purposes of illustration, heat sink 1325 is shown to couple to dies 1310, 1315, and 1320 using, for example, a thermal adhesive. In another aspect, dies 1310, 1315, and 1320 can couple to heat sink 1325 through one or more solder bumps as illustrated with reference to FIG. 8.

FIG. 13 illustrates that the portions of the heat sink, e.g., stem portions, that couple to the interposer need not conform to, or have, the same contact area as the dies that are mounted on top of the interposer. The stem portion of the heat sink can be narrower, can be block shaped, or have any of a variety of different shapes to contact the interposer. Stems of the heat sink, for example, can extend down between adjacent dies, encircle particular dies, or form various shapes, e.g., plus signs or the like, that meander between multiple dies mounted on top of an interposer.

Figure 14:
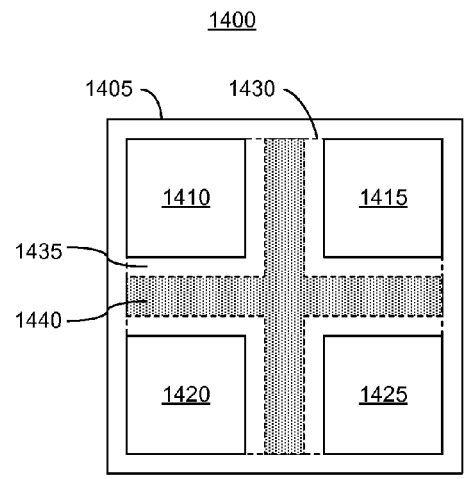
FIG. 14 is a thirteenth block diagram illustrating an overhead view of an IC structure in accordance with another embodiment disclosed within this specification.

FIG. 14 is a thirteenth block diagram illustrating an overhead view of an IC structure 1400 in accordance with another embodiment. IC structure 1400 can include an interposer 1405, dies 1410-1425 mounted on a surface of interposer

1405, and a heat sink 1430. Heat sink 1430, having a top portion 1435 and a stem portion 1440, are illustrated using dashed lines and shown in transparent form to better illustrate the relative positioning of interposer 1405 and dies 1410-1425. In this example, stem portion 1440 of heat sink 1430 is in an "+" or "plus" shape forming channels that extend between dies 1410-1425. As discussed, the particular shape of the heat sink and the stem portion can be tailored to the particular die layout on the interposer.

Figure 15:
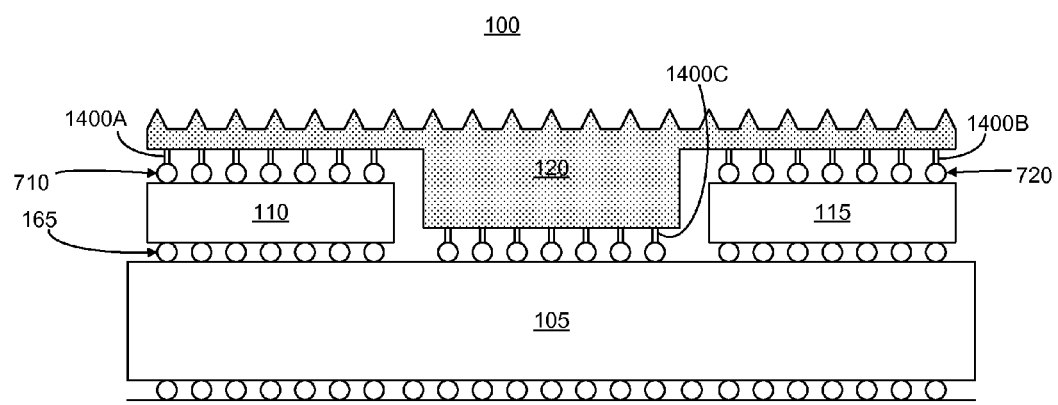
FIG. 15 is a fourteenth block diagram illustrating a cross-sectional side view of IC structure in accordance with another embodiment disclosed within this specification.

FIG. 15 is a fourteenth block diagram illustrating a cross-sectional side view of IC structure 100 in accordance with another embodiment. FIG. 15 illustrates an embodiment in which legs 1400 are included to couple heat sink 120 to interposer 105, die 110, and die 115. In particular, legs 1400A couple solder bumps 710 to heat sink 120. Legs 1400B couple solder bumps 720 to heat sink 120. Legs 1400C couple solder bumps 165 to heat sink 120.

Legs 1400 can be machined or etched, adhered, attached, or deposited onto the underside of heat sink 120, e.g., to surfaces 220, 225, and 230. Legs 1400 can be formed using a material such as copper, though other materials can be used. Legs 1400 can contact and attach to solder bumps 710, 720, and 165 thereby allowing expansion and contraction at different rates while still allowing heat sink 120 to maintain contact with interposer 105, die 110, and die 115 at the various points illustrated. It should be appreciated that legs can be formed of any of a variety of suitable materials that allow for contraction and/or expansion of interposer 105, die 110, die 115, and/or heat sink 120, and that can propagate thermal energy.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, thermally, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. An integrated circuit structure, comprising:
a first die comprising a first surface and a second surface;
a second die comprising a first surface and a second surface;
wherein the first die and the second die are semiconductor dice;
wherein the second die is mounted on the first die with the second surface of the second die facing the first surface of the first die; and
a heat sink mounted on the first surface of the first die and the first surface of the second die;
wherein the first die is an interposer and comprises a first thermal wire coupled to the heat sink;
wherein the first thermal wire is not configured to propagate an electrical signal;
wherein the first thermal wire comprises a first portion formed of a via coupled to the heat sink and extending from the first surface of the interposer and into the interposer and a second portion formed of a first interconnect layer within the interposer that is parallel to the surface of the interposer and perpendicular to the via; and
wherein the second die comprises a second thermal wire coupled to the heat sink, and the second thermal wire comprises a first portion formed of a via coupled to the heat sink and extending from the first surface of the second die and into the second die and a second portion formed of an interconnect layer of the second die that is parallel to the surface of the interposer and perpendicular to the via of the second thermal wire.

2. The integrated circuit structure of claim 1, wherein the heat sink is coupled to the first surface of the first die through a plurality of solder bumps.

3. The integrated circuit structure of claim 1, wherein the heat sink is coupled to the first surface of the second die using a thermally conductive adhesive.

4. The integrated circuit structure of claim 1, wherein the heat sink is coupled to the first surface of the second die through a plurality of solder bumps.

5. The integrated circuit structure of claim 1, wherein the heat sink comprises at least one opening extending from a top surface of the heat sink through to a bottom surface of the heat sink.

6. The integrated circuit structure of claim 1, wherein the heat sink is electrically coupled to a ground potential of the integrated circuit structure.

7. The integrated circuit structure of claim 1, wherein the second interconnect layer is at a different level within the interposer than the first interconnect layer.

8. The integrated circuit structure of claim 1, further comprising:
a package at least partially encompassing the first die and the second die;
wherein the heat sink forms a top portion of the package.

9. The integrated circuit structure of claim 1, further comprising:
a micro-machine fan implemented within the heat sink and with material of the heat sink;
wherein the fan is coupled to a power source.

10. The integrated circuit structure of claim 9, wherein the fan is implemented as a micro-machine within the heat sink.

11. An integrated circuit structure, comprising:
an interposer comprising a first wire and a second wire and having a first surface and a second surface;
a first die mounted on the first surface of the interposer with a first surface of the first die facing the first surface of the interposer;
a second die mounted on the first surface of the interposer with a first surface of the second die facing the first surface of the interposer;
wherein the interposer, the first die, and the second die are semiconductor dice;
wherein the first die and the second die are communicatively linked through the interposer by the first wire; and
a heat sink mounted on the first surface of the interposer, a second surface of the first die, and a second surface of the second die;
wherein the heat sink is coupled to the second wire;
wherein the second wire is not configured to propagate an electrical signal;
wherein the second wire comprises a first portion formed of a via coupled to the heat sink and extending from the first surface of the interposer and into the interposer and a second portion formed of a first interconnect layer within the interposer that is parallel to the surface of the interposer and perpendicular to the via; and wherein the first die comprises a third wire coupled to the heat sink that is not configured to propagate an electrical signal, and the third wire comprises a first portion formed of a via coupled to the heat sink and extending from the second surface of the first die and into the first die and a second portion formed of an interconnect layer of the first die that is parallel to the surface of the interposer and perpendicular to the via of the third wire.

12. The integrated circuit structure of claim 11, wherein the heat sink couples to the surface of the interposer through solder bumps.

13. The integrated circuit structure of claim 11, wherein the heat sink couples to a first portion of the surface of the interposer between a second portion of the surface of the interposer coupled to the first die and a third portion of the surface of the interposer coupled to the second die.

14. The integrated circuit structure of claim 11, wherein the heat sink is coupled to a ground potential of the integrated circuit structure.

15. The integrated circuit structure of claim 11, further comprising:
    a package at least partially encompassing the interposer, the first die, and the second die;
    wherein the heat sink forms a top portion of the package.

16. An integrated circuit structure, comprising:
    an interposer having a first surface and a second surface;
    a first die mounted on the first surface of the interposer with a first surface of the first die facing the first surface of the interposer;
    a second die mounted on the first surface of the interposer with a first surface of the second die facing the first surface of the interposer;
    wherein the interposer, the first die, and the second die are semiconductor dice;
    a heat sink mounted on first surface of the interposer, a second surface of the first die, and a second surface of the second die; and
    a package at least partially encompassing the interposer, the first die, and the second die;
    wherein the interposer comprises a first wire communicatively linking the first die with the second die;
    wherein the heat sink forms a top portion of the package;
    wherein the interposer comprises a second wire not configured to propagate an electrical signal; and
    wherein the second wire comprises a first portion formed of a via coupled to the heat sink and extending from the first surface of the interposer and into the interposer and a second portion formed of a first interconnect layer within the interposer that is parallel to the surface of the interposer and perpendicular to the via; and
    wherein the first die comprises a third wire coupled to the heat sink that is not configured to propagate an electrical signal, and the third wire comprises a first portion formed of a via coupled to the heat sink and extending from the second surface of the first die and into the first die and a second portion formed of an interconnect layer of the first die that is parallel to the surface of the interposer and perpendicular to the via of the third wire.

17. The integrated circuit structure of claim 16, wherein the second die comprises a fourth wire coupled to the heat sink that is not configured to propagate an electrical signal;
    wherein the fourth wire comprises a first portion formed of a via coupled to the heat sink and extending from the second surface of the second die and into the second die and a second portion formed of an interconnect layer of the second die that is parallel to the surface of the interposer and perpendicular to the via of the third wire.

* * * * *